United States Patent
Ho et al.

[11] Patent Number: 5,923,971
[45] Date of Patent: Jul. 13, 1999

[54] RELIABLE LOW RESISTANCE STRAP FOR TRENCH STORAGE DRAM CELL USING SELECTIVE EPITAXY

[75] Inventors: Herbert L. Ho, New Windsor, N.Y.; Andre R. LeBlanc, Essex Junction, Vt.; Jack A. Mandelman, Stormville, N.Y.; Radhika Srinivasan, Ramsey, N.J.

[73] Assignee: International Business Machines Corporation, Armonk, N.Y.

[21] Appl. No.: 08/731,940

[22] Filed: Oct. 22, 1996

[51] Int. Cl.⁶ ............................................. H01L 21/8242
[52] U.S. Cl. ...................... 438/245; 438/246; 438/388; 438/389
[58] Field of Search .................. 438/245, 246, 438/388, 389

[56] References Cited

U.S. PATENT DOCUMENTS

| | | |
|---|---|---|
| 4,801,988 | 1/1989 | Kenney . |
| 5,185,294 | 2/1993 | Lam et al. . |
| 5,250,829 | 10/1993 | Bronner et al. . |
| 5,264,716 | 11/1993 | Kenney . |
| 5,348,905 | 9/1994 | Kenney . |
| 5,362,663 | 11/1994 | Bronner et al. . |
| 5,369,049 | 11/1994 | Acocella et al. ................... 438/243 |
| 5,384,277 | 1/1995 | Hsu et al. ........................... 438/243 |
| 5,384,474 | 1/1995 | Park et al. . |
| 5,389,559 | 2/1995 | Hsieh et al. . |
| 5,395,786 | 3/1995 | Hsu et al. . |
| 5,422,294 | 6/1995 | Noble, Jr. .......................... 438/246 |
| 5,521,115 | 5/1996 | Park et al. ......................... 438/243 |

*Primary Examiner*—John F. Niebling
*Assistant Examiner*—John Murphy
*Attorney, Agent, or Firm*—Whitham, Curtis & Whitham; Darrel Neff

[57] ABSTRACT

Strap resistance, surface strap shorts and wordline capacitance can be reduced by providing a selectively grown silicon strap which tapers away from spacer nitride and has less contact with spacer nitride. In addition the strap is optionally doped with an arsenic implant which reduces resistance.

11 Claims, 12 Drawing Sheets

RELIABLE LOW RESISTANCE STRAP FOR TRENCH STORAGE DRAM CELL USING SELECTIVE EPITAXY

BACKGROUND OF THE INVENTION

1. Field of the Invention

The present invention generally relates to a method of fabricating dynamic random access memory (DRAM) cells, and more particularly, to producing a DRAM cell having lower strap resistance, fewer surface strap shorts and reduced wordline capacitance.

2. Background Description

Current DRAM technologies have many problems. First, high strap resistance occurs at low temperatures. It is believed that the temperature sensitivity of the strap is due to interface resistance resulting from native interfacial oxide. Second, there is a high incidence of gate conductor to surface strap shorts. Two Reactive Ion Etches (RIE) of the spacer nitride are required during strap formation, one for removal of a borophosphorous silicate glass (BPSG) layer and one for Trench Top etch. Third, many known processes are undesirably complex for manufacturing purposes.

A conventional process opens a window in the BPSG prior to deposition of strap polysilicon. This requires that the interface be clean to assure a low resistance contact between strap and polysilicon node and between the strap and the active area. However, the effects of native oxide and other contaminants on the exposed surfaces frequently result in poor strap resistance at low temperature.

SUMMARY OF THE INVENTION

It is therefore an object of the present invention to provide a facile process for fabricating DRAMs which reduces strap resistance, surface strap shorts, and wordline capacitance.

In the present invention, the height at which the surface strap is in contact with the spacer nitride is significantly reduced. Unlike a scheme where the surface strap is in contact with the spacer nitride for heights extending up to the gate metallic conductor, this height is reduced by about 50% relative to the gate metallic conductor in the present invention. The contact area is reduced as a result of the selective epitaxy pulling away. As selective silicon grows, it pulls away from the spacer forming a taper. The above conditions for selective silicon epitaxial growth result in desensitizing gate conductor to surface strap shorts and a decrease in gate conductor (wordline) to strap capacitance.

The selective silicon and polysilicon process results in process simplification; eliminating one borophosphorous silicate glass (BPSG) deposition, eliminating a BPSG anneal, and eliminating a surface strap recess etch.

The process for forming an epitaxial strap is simplified. First, a nitride barrier layer is deposited over active area oxide. Next, a strap mask is used to etch openings to the active area silicon and deep trench polysilicon. Then, selective epitaxial growth occurs on exposed silicon and polysilicon surfaces. This epitaxial growth is selective to the oxide and nitride insulating layers. Next, an N-type dopant such as arsenic is optionally implanted to reduce strap resistance. Finally, the structure is taken through two anneals.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2:
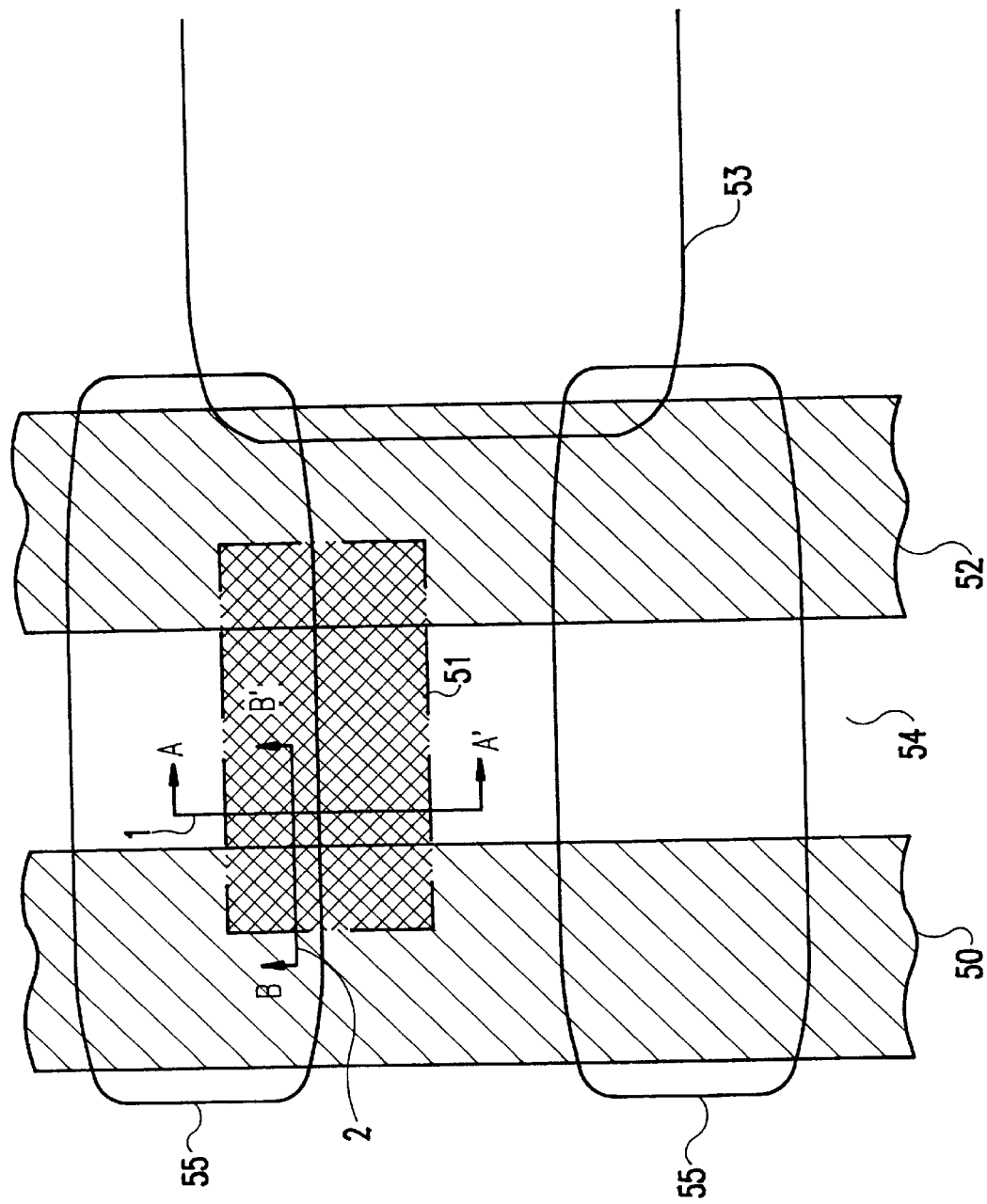
FIG. 2 is a top view of a portion of the memory array.

Referring now to the drawings, and more particularly to FIG. 2, there is shown a top view of a portion of a DRAM cell showing the inventive structure. An A–A' plane 1 is defined and a B–B' plane 2 is defined. This top view includes an active wordline 50, strap mask 51, passing wordline 52, and isolation 53. Between wordlines 50 and 52 is nitride 54. The strap mask 51 represents a window opened in the nitride 54 to build the inventive structure. Ovals 55 are deep trenches containing storage capacitors for DRAM. In following drawing figures, reference numerals which are the same in different figures refer to the same structure.

Figure 1:
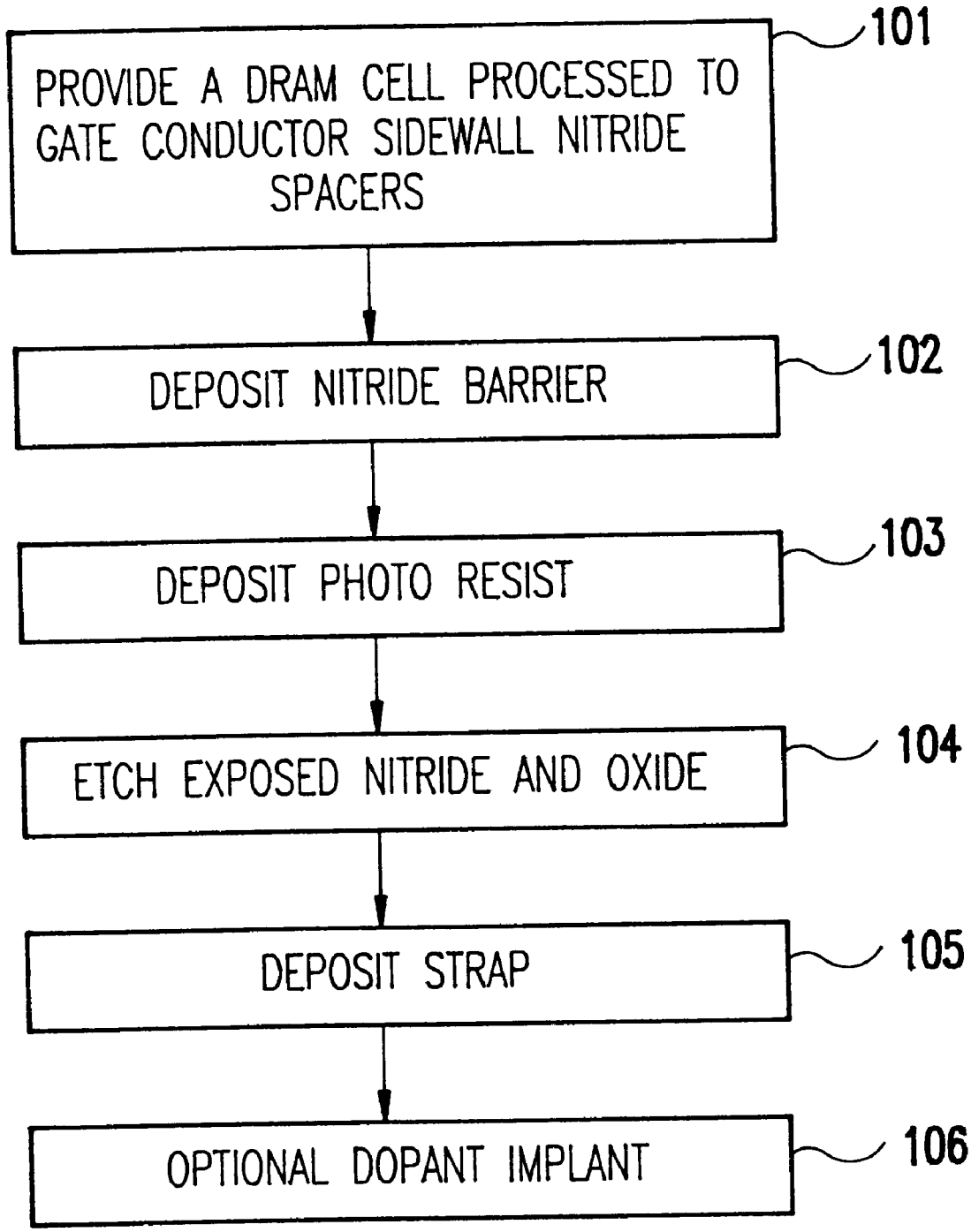
FIG. 1 is a flow chart showing the inventive process.
Figure 3:
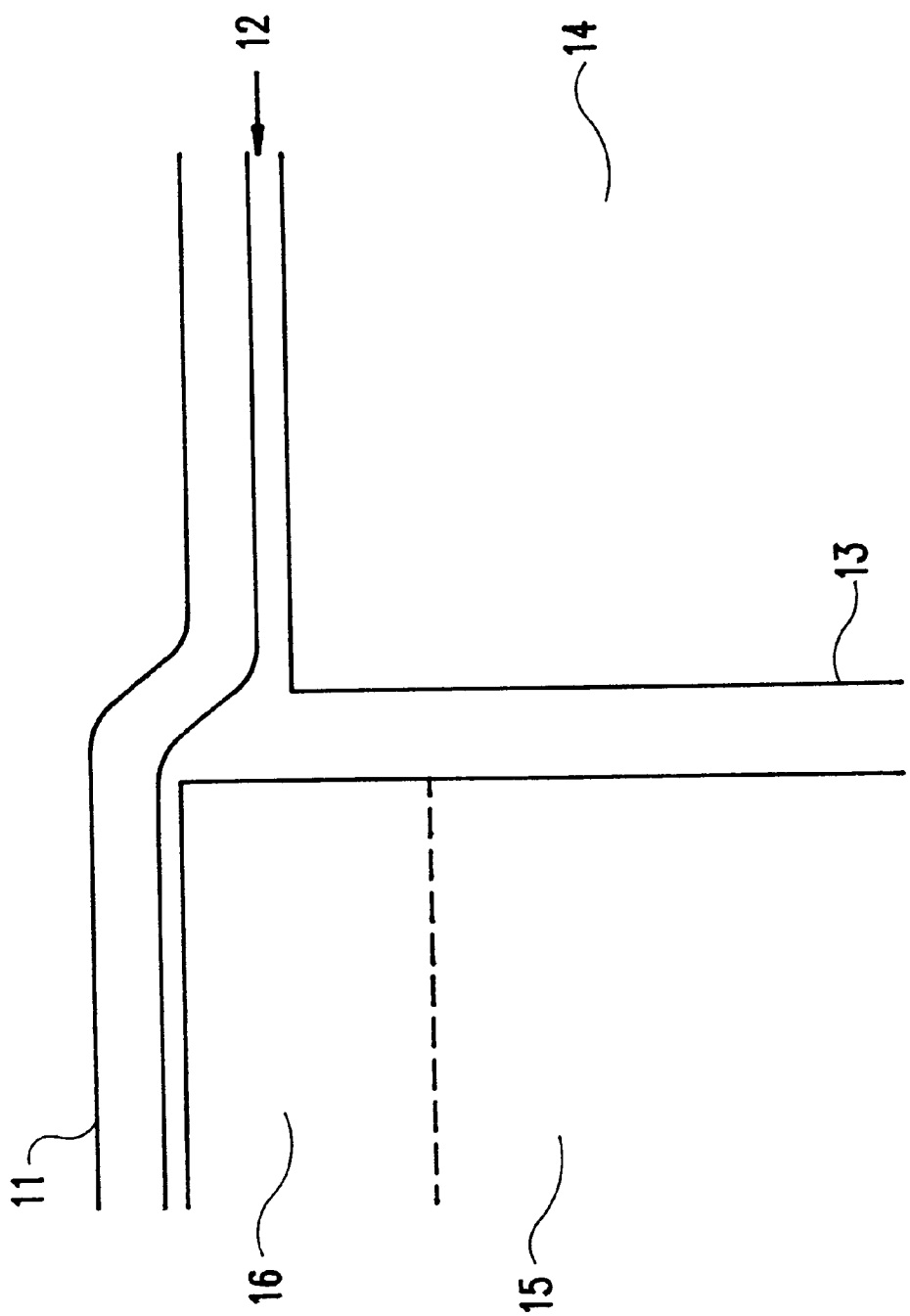
FIG. 3 is a cross-sectional view showing the A–A' plane defined in FIG. 2 following the second step of the inventive process.

The process of the inventive method is shown in the flow diagram of FIG. 1. FIG. 1 will be discussed with reference to FIGS. 3–5 which show a series of cross sectional views along the A–A' plane 1 during the steps of the inventive method. As shown in cell 101, the DRAM cell is processed up to gate conductor definition, gate sidewall oxidation source/drain junction implants and formation of gate sidewall nitride spacers. Then as shown in cell 102, a nitride barrier layer is deposited over the active area oxide and the deep trench (DT) top oxide. This is shown in the cross-sectional view of FIG. 3 where nitride barrier layer 11 is deposited over oxide 12 and collar oxide 13. The collar oxide 13 separates the N+ polysilicon storage trench capacitor 14 from N+ node diffusion (or active area silicon) 16 over a DRAM array P-well 15.

Figure 4:
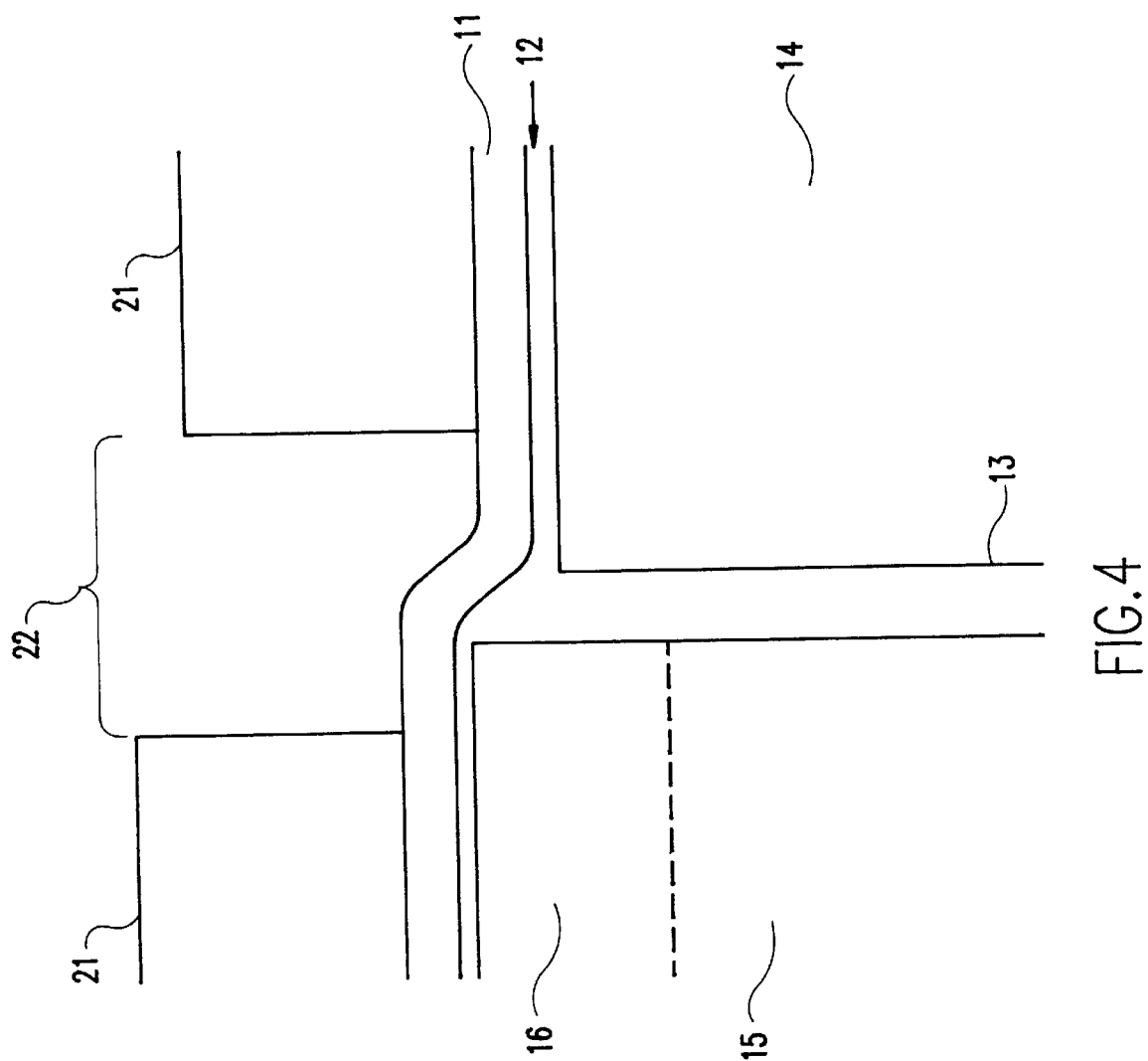
FIG. 4 is a cross-sectional view showing the A–A' plane defined in FIG. 2 following the third step of the inventive process.
Figure 5:
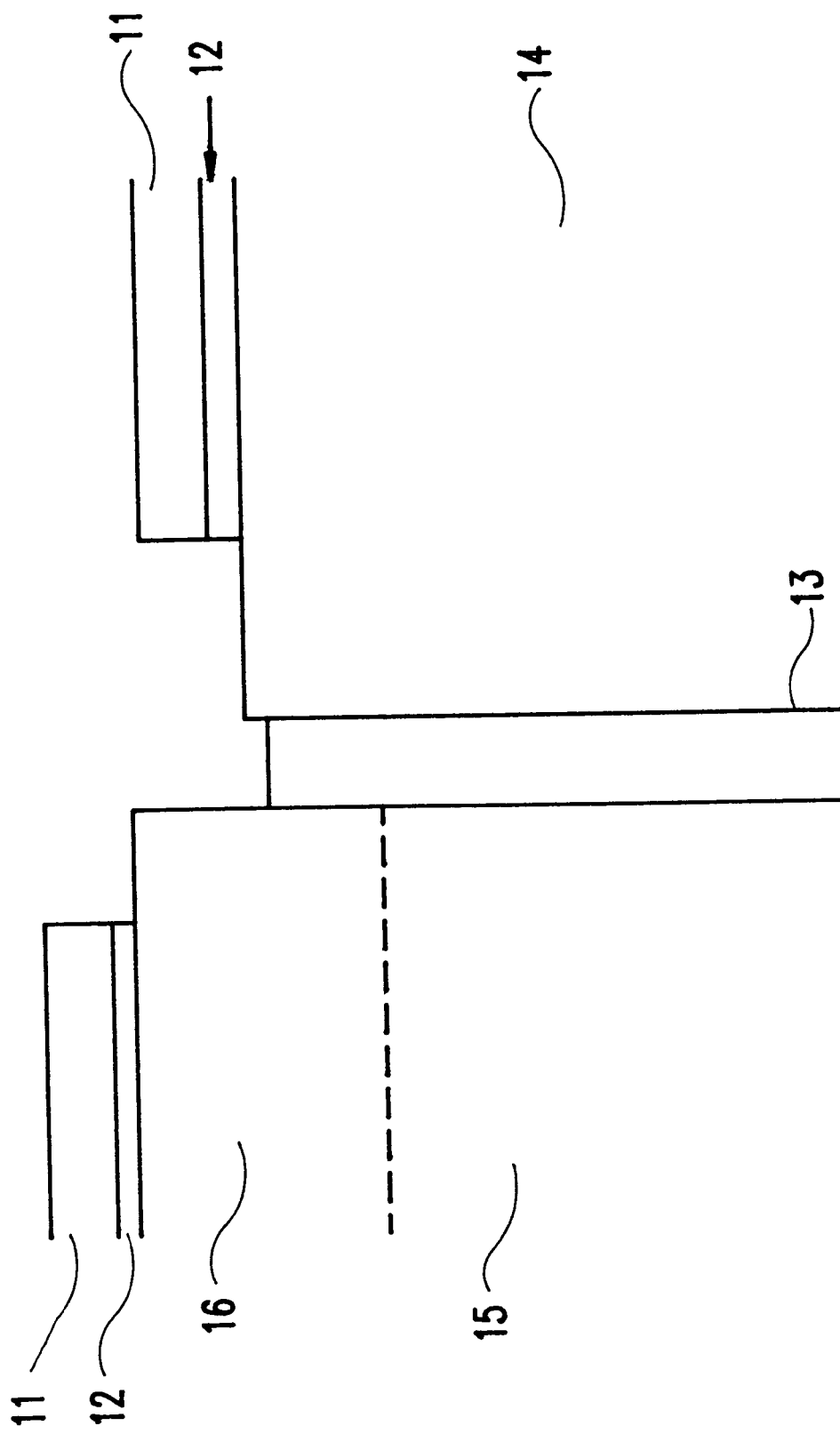
FIG. 5 is a cross-sectional view showing the A–A' plane defined in FIG. 2 following the fourth step of the inventive process.

The second step is to use a strap mask to open the areas to the active area silicon 16 and deep trench polysilicon 14 on which the epitaxial layer will be grown. The steps to accomplish this are shown in cells 103 and 104 of FIG. 1. First, as shown in cell 103, photo resist is deposited. This is shown in FIG. 4 where a photo resist mask 21 is positioned over nitride barrier 11. There is a mask opening 22 to provide for etching of the appropriate area. Returning to FIG. 1 the next step, shown in cell 104, is to directionally etch the nitride and oxide down to bare silicon. The directional etch forms nitride spacers on the edges of the gate conductors. This provides protection against strap to wordline shorts. The photo resist mask 21 is then removed. The resulting structure is shown in FIG. 5.

Figure 6:
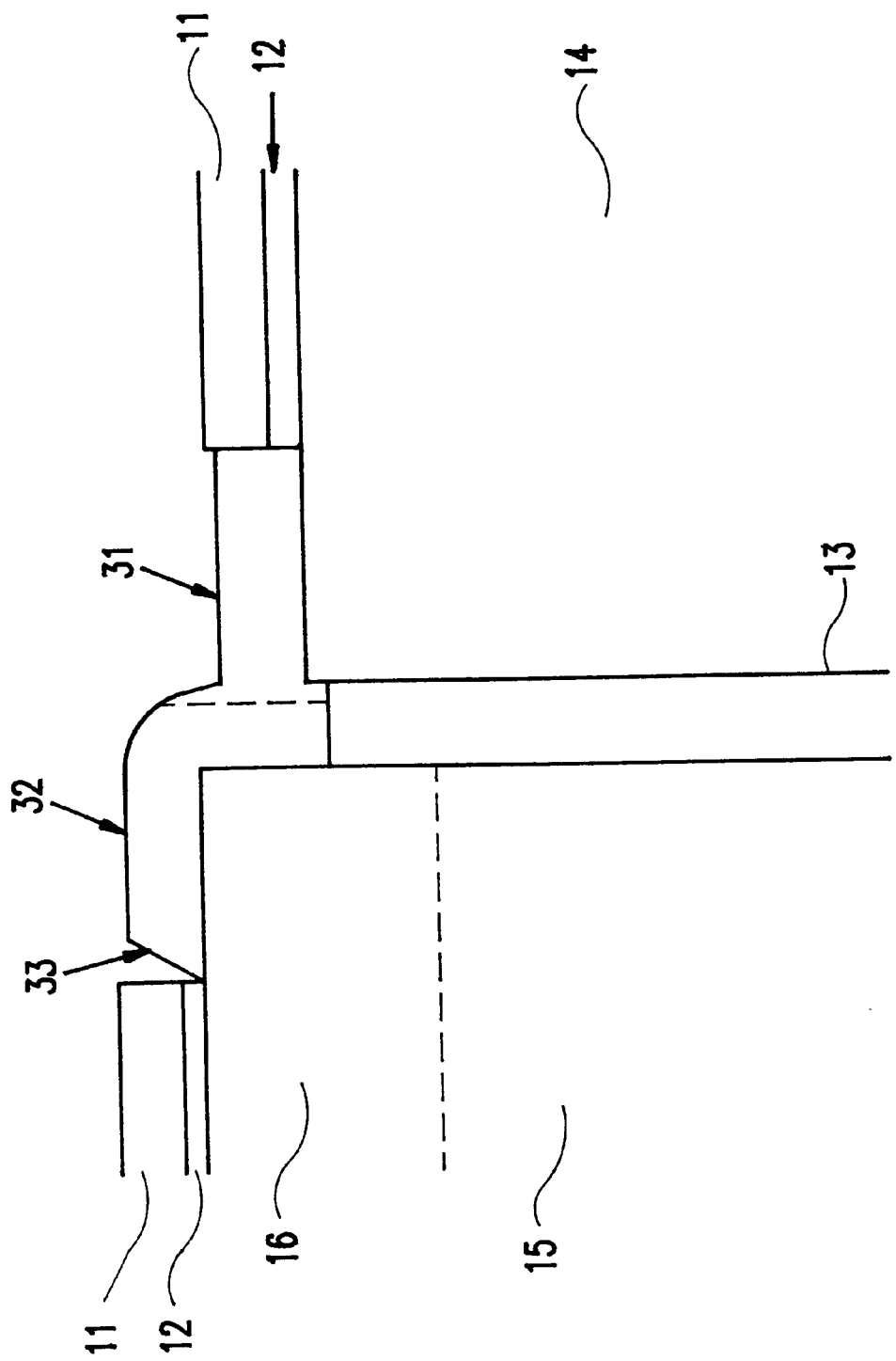
FIG. 6 is a cross-sectional view showing the A–A' plane defined in FIG. 2 following the fifth step of the inventive process.

In FIG. 1, the next step is shown in cell 105 where a selective epitaxial strap is deposited at 900° C. prior to which a bake at 925° C. in an $H_2$ ambient is performed to insure the cleanliness and integrity of the interface. The hydrogen consumes the native oxide on the silicon surfaces, insuring a clean surface for silicon nucleation. The selective epitaxy deposits only on the exposed silicon and polysilicon surfaces and not on the nitride. This is shown in FIG. 6. The deposited epitaxy matches the crystalline structure of the surface on which it is grown. For this reason, epitaxy portion 31 grown over N+ polysilicon will have a different structure than epitaxy portion 32 grown over active area silicon. Another feature of the epitaxy is a facet shaped void 33 which forms as the silicon layer grows away from the nitride in nitride barrier layer 11. It is well known in the art that an epitaxially grown layer matches (replicates) the orientation of the crystal structure below it. The facet 33 is shown oriented approximately on the <111> crystal plane, but in practice it may be rounded. The <111> faceting pulls the silicon in epitaxy portion 32 away from the bounding sidewall of nitride barrier layer 11, resulting in reduced incidence of shorts and reduced capacitance. No facet forms between epitaxy portion 31 and nitride barrier 11 which is over DT polysilicon 14 because the DT polysilicon 14 has no specific crystalline orientation to be matched by the deposited epitaxy.

Figure 7:
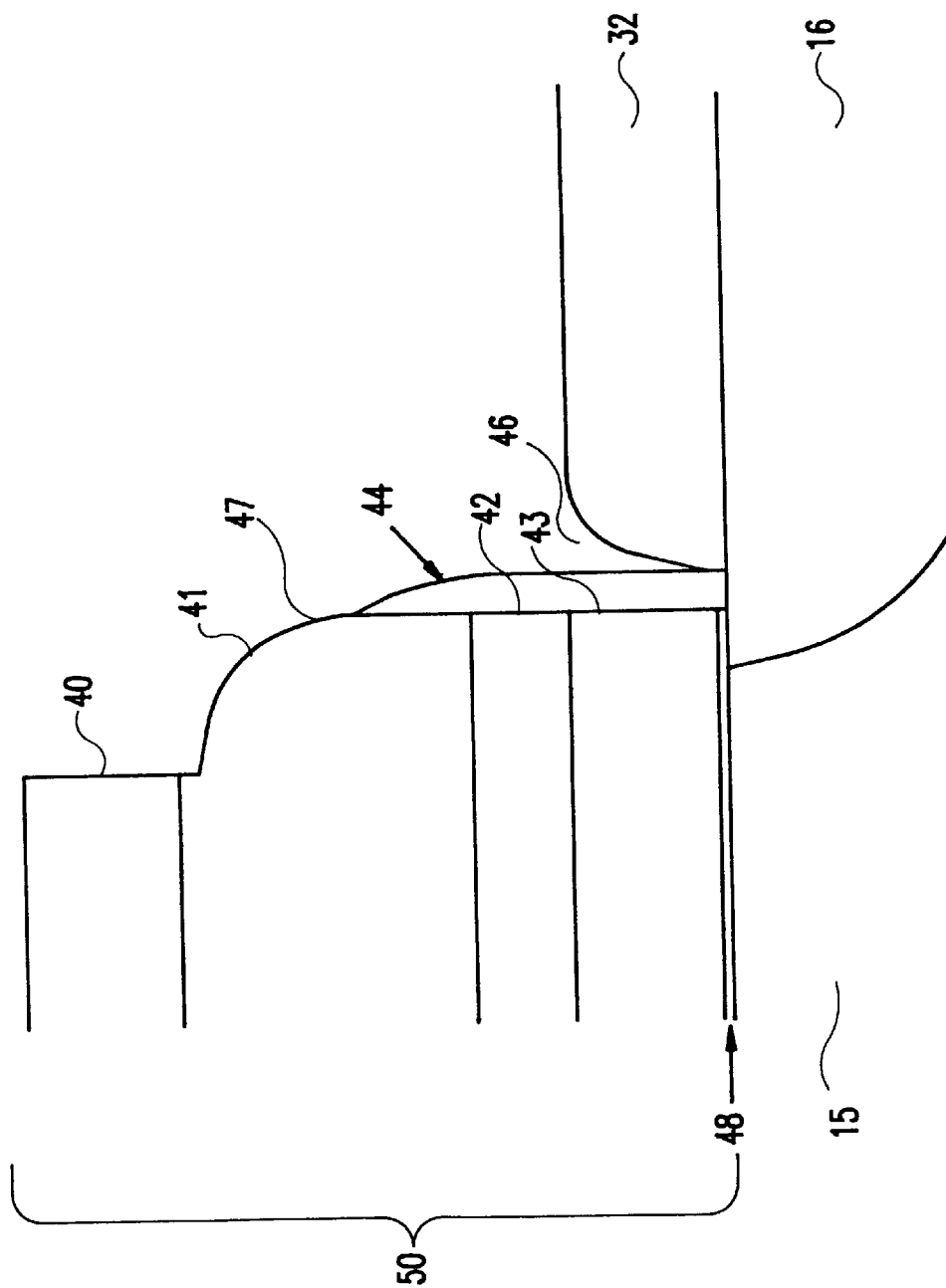
FIG. 7 is a cross-sectional view showing the B–B' plane defined in FIG. 2.

FIG. 7 shows a cut in the B–B' plane following selective epitaxial growth. In this figure, nitride barrier 40, nitride cap 41, silicide 42, N+ polysilicon 43, and gate oxide 48 make up part of the active wordline 50 which is shown in FIG. 2. The active wordline 50 forms the gate of the Field Effect Transistor to which the strap is connected. A nitride spacer 44, separates the epitaxy portion 32 which was deposited over N+ node diffusion 16 and P-well 15. Attention is directed to the <111> facet shape void 46 pulling away from the nitride spacer 44 at the wordline sidewall 47.

The inventive structure has faceting in the epitaxial growth which can occur in at least three locations. These locations include both wordline sidewalls, and at one intersection of the strap mask and nitride between the wordlines.

Figure 8:
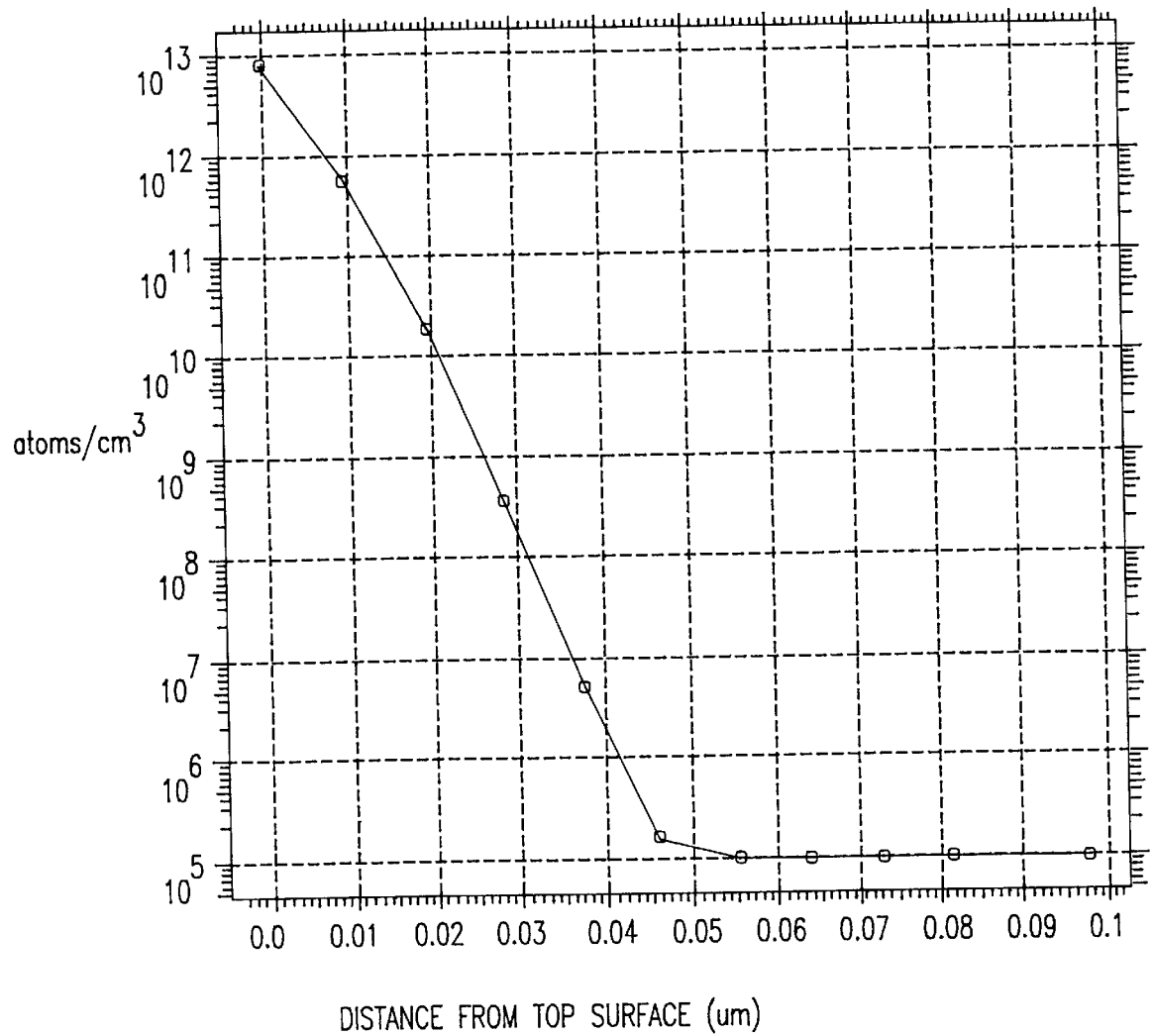
FIG. 8 is a graph showing a plot of arsenic doping resulting from arsenic implantation in the nitride.

Following the deposition of the strap as is shown in cell 106 of FIG. 1, an N-type implant such as arsenic is optionally performed (typically at an ion dose of 4.0E15 per $cm^2$ at an ion energy level of 10 KeV) to reduce the strap resistance. The ion implanted alternatively could be phosphorous. Depending on the thermal cycles following the strap growth the implant might not be required. Modeling shows that the nitride barrier 11 is sufficient for preventing serious counter doping of the PFET junctions. FIG. 8 shows the end of process arsenic tail in the silicon resulting from implantation into the nitride barrier 11. FIG. 8 shows the surface ion concentration is less than 1E13 atoms per $cm^3$ which is more than sufficient to prevent counter doping.

The remaining thermal budget includes one anneal at 800° C. for 30 minutes and an anneal at 970° C. for 10 seconds. Modeling shows that the arsenic gets well distributed throughout the polycrystalline portion of the strap, but does not move very much in the single crystal portion. Despite some relatively low doping areas in the strap, modeling shows that distances between higher doped region is sufficiently short to allow electrons to diffuse across the low doped portions. The net result is that the resistance of the strap is between 200 and 600 ohm-um.

Figure 9:
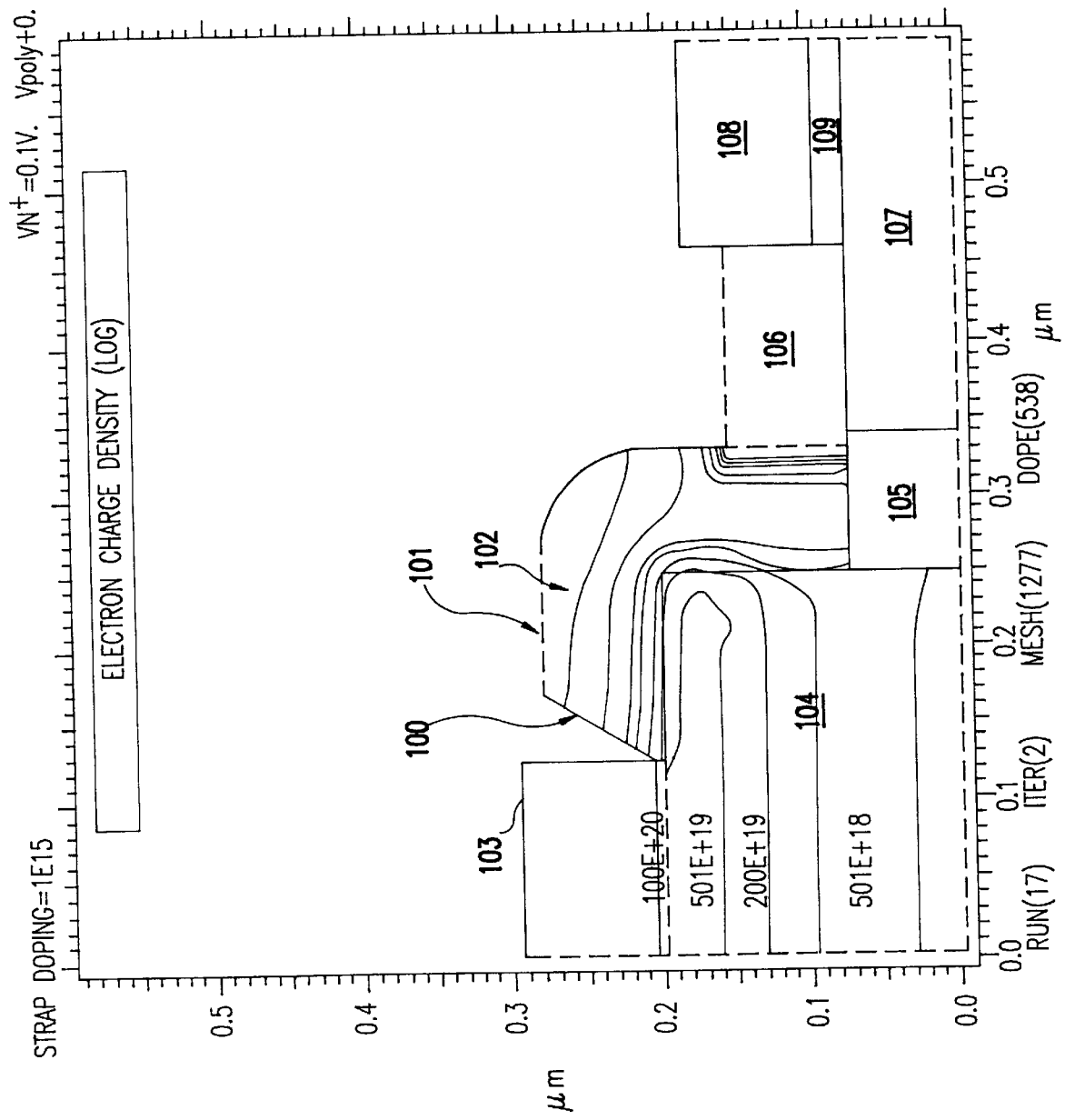
FIG. 9 is a graph showing modeling of an idealized structure.
Figure 10:
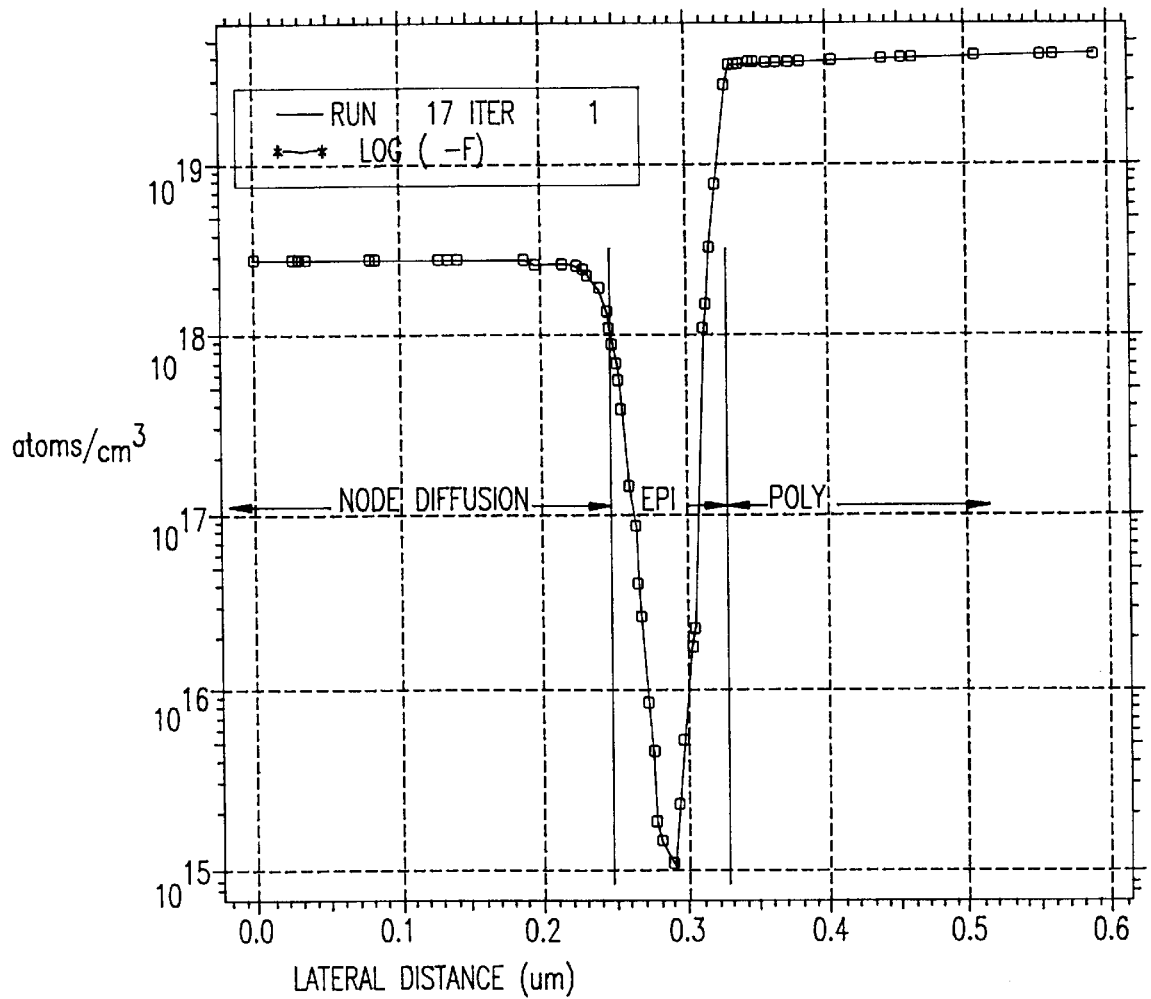
FIG. 10 is a graph showing a plot of doping along a cut line running horizontally through the strap (y=0.12 $\mu$m)
Figure 11:
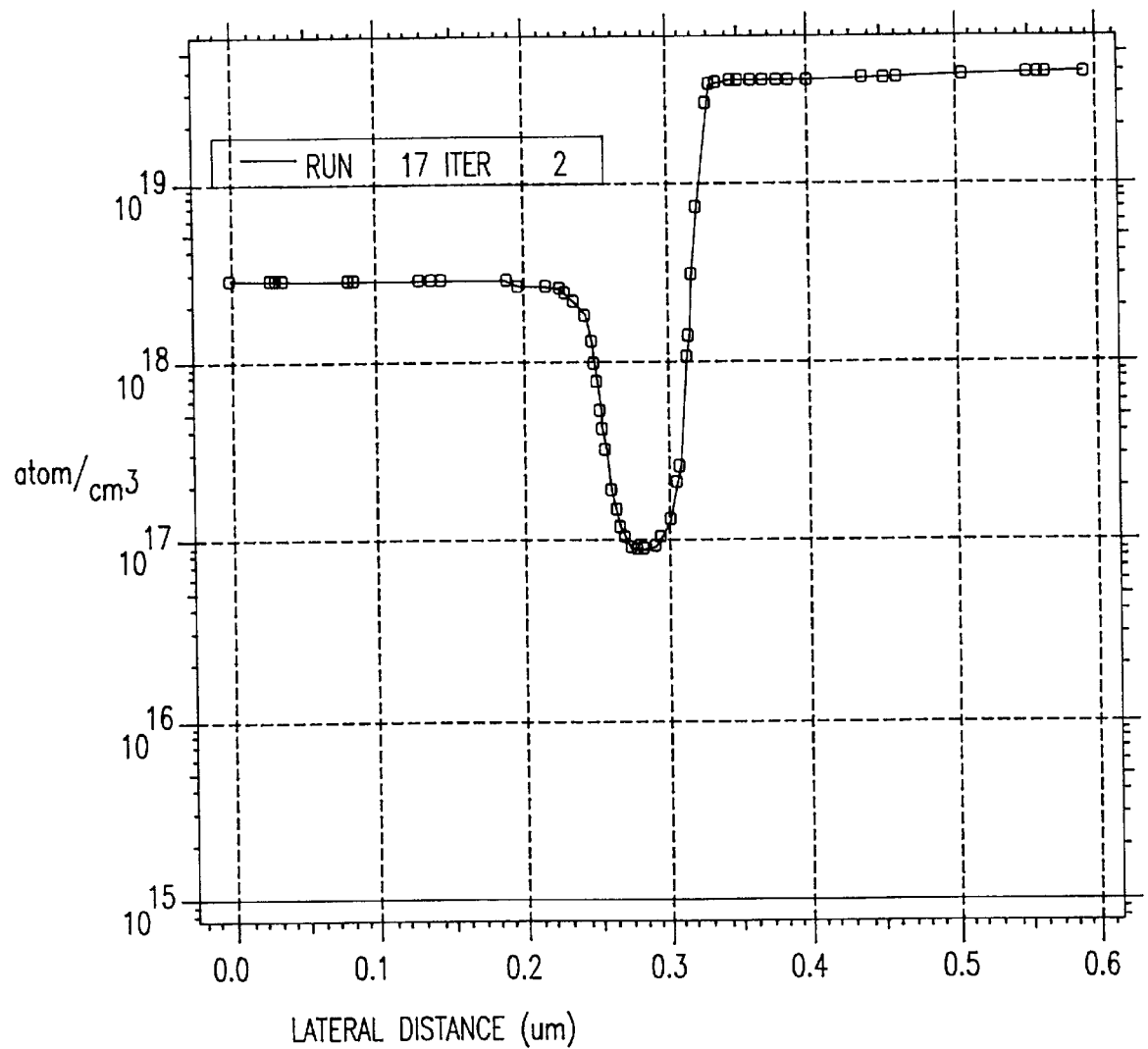
FIG. 11 is a graph showing electron concentration along the same cut line at an applied bias of 0.1 V, which is a realistic value during the writing of a high level.

FIGS. 10 and 11 are best understood with reference to FIG. 9. FIG. 9 is a graph showing the modeled doping distribution in the strap. As can be seen, facet 100 shows the growth of the strap on the <111> crystal plane. At the surface 101 of the epitaxy 102 the crystal plane is <100>. This epitaxy 102 has grown away from nitride 103 thereby reducing shorts. The epitaxy 102 surrounds the N+ node diffusion 104 and is over collar oxide 105 adjacent to the epitaxy 102, on the opposite side of the N+ node diffusion 104, is the polysilicon portion 106 of the strap over trench polysilicon 107 and adjacent nitride 108 and oxide 109.

FIG. 10 shows a plot in a case where the strap is doped in situ at a concentration of 1E15 atoms/$cm^3$ and without an implant. This is considered an extreme case. The doping dips down to 1E15 atoms/$cm^3$ at the middle of the strap as can be seen in FIG. 10.

FIG. 11 shows the electron concentration along the same cut line at an applied bias across the strap of 0.1V, which is a realistic value during the writing of a high level. Note that electron diffusion fills in the low doped region. In this extreme case, the strap resistance is approximately 600 ohm-um.

Figure 12:
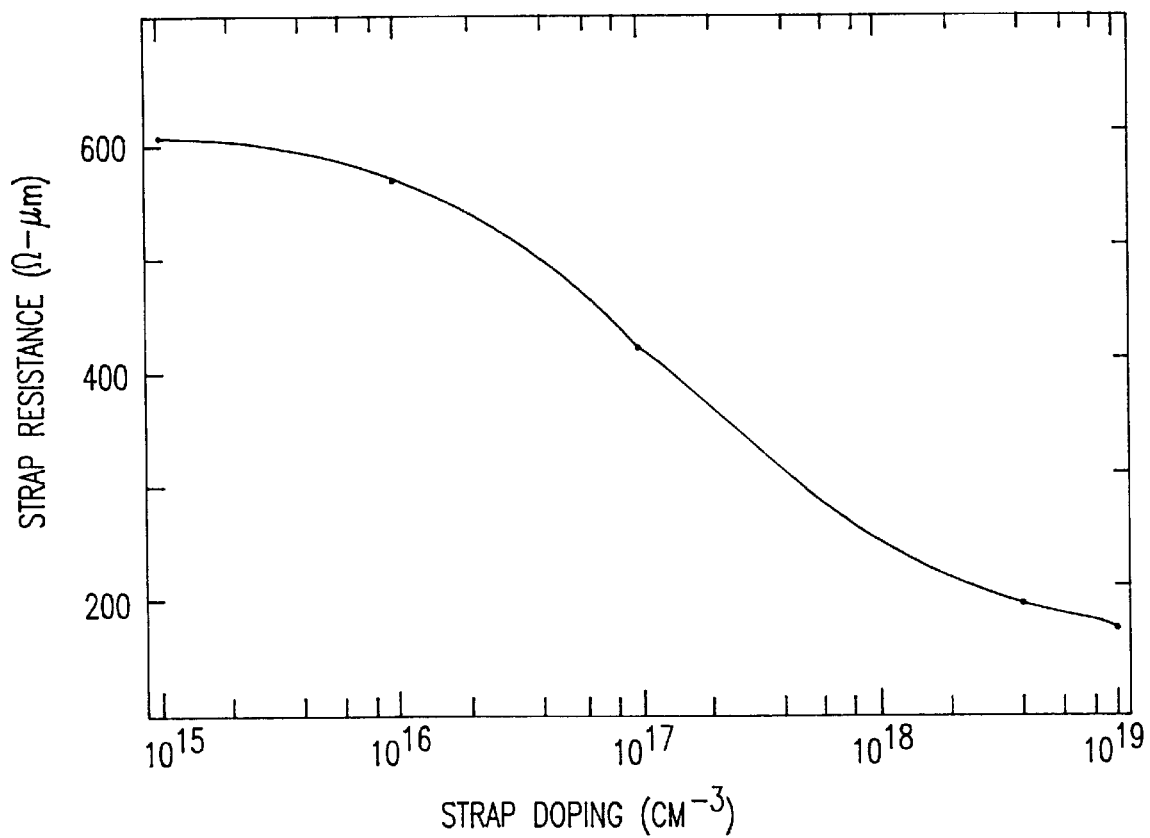
FIG. 12 is a graph showing a plot of strap resistance versus strap doping (no implant).

FIG. 12 shows a plot of strap resistance v. strap doping (no implant). With an implant of 4E15 atoms/$cm^3$ at 10 KeV arsenic, the resistance drops down to the low 200 ohm-um range (1E15 atoms/$cm^3$ background strap doping).

FIGS. 11 and 12 show that acceptable strap resistance is obtained even without an additional strap implant. Anything less than or equal to about 1000 $\Omega$-$\mu$m is an improvement over the prior art.

In an alternative embodiment a P-type MOSFET is implanted with a P-type dopant such as boron.

While the invention has been described in terms of its preferred embodiments, those skilled in the art will recognize that the invention can be practiced with modification within the spirit and scope of the appended claims.

We claim:

1. A method of forming a surface strap connection in a trench storage DRAM cell, comprising the steps of:
   depositing a nitride barrier on active area oxide and trench top oxide of a DRAM cell;
   providing an opening in said nitride barrier and said active area oxide and said trench top oxide which extends to an active silicon area and a trench polysilicon area; and
   selectively growing epitaxial silicon on said active silicon area and said trench polysilicon area, said epitaxial silicon growing away from said nitride barrier to form a facet shaped void between said epitaxial silicon and said nitride barrier.

2. The method of claim 1, further comprising the step of annealing said DRAM cell before said step of selectively growing.

3. The method of claim 1, further comprising the step of annealing said DRAM cell after said step of selectively growing.

4. A method as recited in claim 3, further comprising the step of selecting said DRAM cell to have a source-drain diffusion and storage trench polysilicon containing an N-type dopant.

5. A method as in claim 4, further comprising implanting a second N-type dopant in said surface strap connection prior to said step of annealing.

6. A method as recited in claim 5 further comprising the step of selecting said second dopant to be arsenic.

7. A method as recited in claim 5 further comprising the step of selecting said second dopant to be phosphorous.

8. A method as recited in claim 3, further comprising the step of selecting said DRAM cell to have a source-drain diffusion and storage trench polysilicon containing an P-type dopant.

9. A method as recited in claim 5, further comprising implanting a second P-type dopant in said surface strap connection prior to said step of annealing.

10. A method as in claim 9, wherein said dopant is boron.

11. A method as in claim 1, further comprising consuming native oxide prior to the step of depositing an epitaxy silicon.

* * * * *